(12) United States Patent
Bao et al.

(10) Patent No.: US 11,805,676 B2
(45) Date of Patent: Oct. 31, 2023

(54) PACKAGE STRUCTURE, METHOD FOR FORMING PACKAGE STRUCTURE, DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Zheng Bao, Beijing (CN); Kang Wang, Beijing (CN); Xiaodong Hao, Beijing (CN); Junyue Yuan, Beijing (CN); Yanxia Xin, Beijing (CN); Gong Chen, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 17/472,780

(22) Filed: Sep. 13, 2021

(65) Prior Publication Data
US 2022/0085339 A1 Mar. 17, 2022

(30) Foreign Application Priority Data
Sep. 14, 2020 (CN) .......................... 202010961874.9

(51) Int. Cl.
*G02F 1/1335* (2006.01)
*H10K 50/86* (2023.01)
*H10K 50/87* (2023.01)
*H10K 59/40* (2023.01)
(Continued)

(52) U.S. Cl.
CPC ....... *H10K 50/86* (2023.02); *G02F 1/133528* (2013.01); *G06F 3/041* (2013.01);
(Continued)

(58) Field of Classification Search
CPC ............... H01L 51/5281; H01L 27/323; H01L 27/3234; H01L 51/56; H01L 51/529;
(Continued)

(56) References Cited

U.S. PATENT DOCUMENTS

2009/0322125 A1 12/2009 Berger et al.
2020/0117034 A1* 4/2020 Yin .................. G02F 1/1339
(Continued)

FOREIGN PATENT DOCUMENTS

CN 204480220 U 7/2015
CN 110187427 A 8/2019
(Continued)

OTHER PUBLICATIONS

CN 202010961874.9 first office action.

*Primary Examiner* — Mariam Qureshi
(74) *Attorney, Agent, or Firm* — IPRO, PLLC

(57) ABSTRACT

A package structure, a method for forming a package structure, a display panel and a display device are provided. The package structure includes: a polarizing structure and a first optical adhesive layer; the polarizing structure includes a first viewing aperture corresponding to a camera; the first optical adhesive layer is arranged at a side of the polarizing structure, and at least a part of the first viewing aperture is filled with the first optical adhesive layer.

10 Claims, 5 Drawing Sheets

(51) Int. Cl.
    *H10K 59/65* (2023.01)
    *H10K 71/00* (2023.01)
(52) U.S. Cl.
    CPC ............ *H04N 23/50* (2023.01); *H10K 50/87* (2023.02); *H10K 59/40* (2023.02); *H10K 59/65* (2023.02); *H10K 71/00* (2023.02); *G02F 2202/28* (2013.01)
(58) Field of Classification Search
    CPC ........... H01L 51/5237; G02F 1/133528; G02F 2202/28; G02F 1/1333; G06F 3/041; G06F 3/0412; G06F 2203/04103; H04N 23/50; H04N 23/52; H04N 23/57; G09F 9/30
    See application file for complete search history.

(56) References Cited

U.S. PATENT DOCUMENTS

| | | | | |
|---|---|---|---|---|
| 2020/0192142 | A1* | 6/2020 | Kim | G02F 1/133528 |
| 2021/0356641 | A1 | 11/2021 | Liu et al. | |
| 2021/0367214 | A1* | 11/2021 | Wang | H01L 51/56 |
| 2021/0384478 | A1* | 12/2021 | Ge | H01L 27/323 |
| 2021/0392767 | A1* | 12/2021 | E | H05K 5/03 |
| 2022/0208897 | A1* | 6/2022 | Yue | H01L 27/3234 |

FOREIGN PATENT DOCUMENTS

| | | |
|---|---|---|
| CN | 110471499 A | 11/2019 |
| CN | 110908163 A | 3/2020 |
| CN | 111599841 A | 8/2020 |
| CN | 211207839 U | 8/2020 |

* cited by examiner

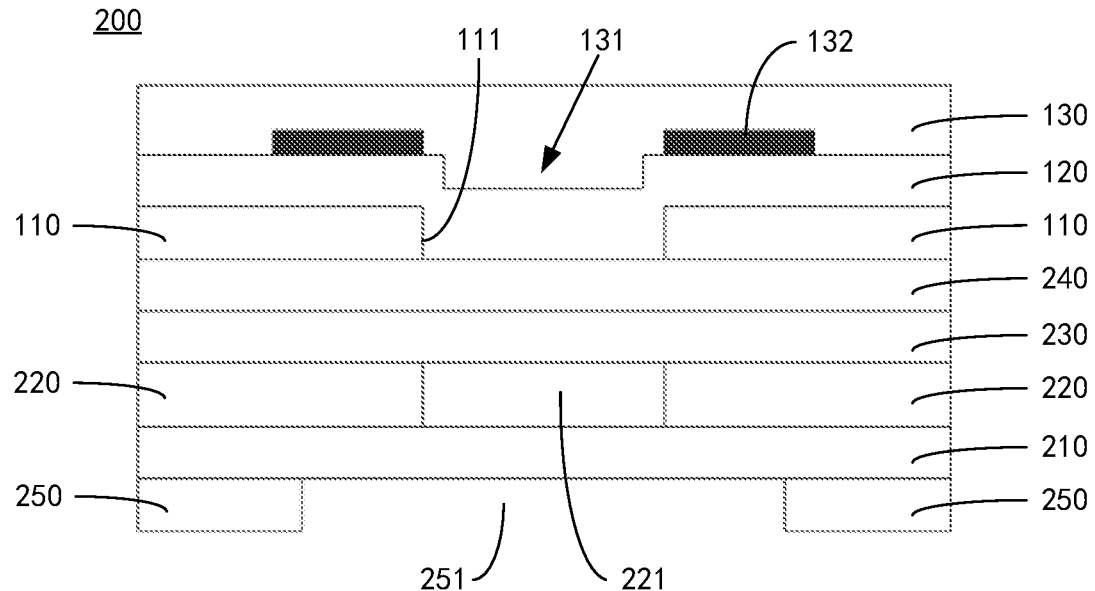

Fig.4

| | |
|---|---|
| adhering the first optical adhesive layer to one side of the polarizing structure with the first viewing aperture so that the first optical adhesive layer at least fills part of the first viewing aperture | S101 |
| adhering the cover plate to one side, away from the polarizing structure, of the first optical adhesive layer. The cover plate includes a protrusion corresponding to the first viewing aperture, or the cover plate includes a protrusion corresponding to the first viewing aperture and a light-shielding ring surrounding the protrusion; the protrusion is contacted with the part of the first optical adhesive layer corresponding to the first viewing aperture | S102 |

Fig.5

PACKAGE STRUCTURE, METHOD FOR FORMING PACKAGE STRUCTURE, DISPLAY PANEL AND DISPLAY DEVICE

CROSS-REFERENCE TO RELATED APPLICATIONS

This application claims priority to Chinese Patent Application No. 202010961874.9 filed in China on Sep. 14, 2020, the entire contents of which are incorporated herein by reference.

TECHNICAL FIELD

The disclosure relates to the technical field of display, in particular to a package structure, a method for forming a package structure, a display panel and a display device.

BACKGROUND

With the development of display technology, the market demands higher and higher for the screen size of display products, and display products with narrow frames and even without frames are pursued in the market.

In a display product with a front camera, the position of the camera has to be moved into the display area, and usually a viewing aperture for viewing the camera needs to be opened in at least a part of the film layer of the display panel. However, due to the viewing aperture, the display panel has the defects that the structural strength of the film layer is reduced, or the film layer is easily deformed to affect the optical performance of the camera.

SUMMARY

A package structure is provided in the present disclosure, including: a polarizing structure and a first optical adhesive layer;

the polarizing structure includes a first viewing aperture corresponding to a camera;

the first optical adhesive layer is arranged at a side of the polarizing structure, and at least a part of the first viewing aperture is filled with the first optical adhesive layer.

Optionally, a ratio of a thickness of a portion of the first optical adhesive layer arranged in the first viewing aperture to a depth of the first viewing aperture is not less than 0.13.

Optionally, the package structure further includes a cover plate;

the cover plate is arranged at a side, away from the polarizing structure, of the first optical adhesive layer;

a protrusion corresponding to the first viewing aperture is at a side of the cover plate close to the first optical adhesive layer.

Optionally, the package structure further includes a cover plate;

the cover plate is arranged at a side, away from the polarizing structure, of the first optical adhesive layer;

a protrusion corresponding to the first viewing aperture is at a side of the cover plate close to the first optical adhesive layer.

Optionally, the protrusion is in contact with a portion of the first optical adhesive layer corresponding to the first viewing aperture.

Optionally, the cover plate includes a light-shielding ring surrounding the protrusion.

Optionally, the protrusion is in contact with a portion of the first optical adhesive layer corresponding to the first viewing aperture, and the cover plate includes a light-shielding ring surrounding the protrusion.

A display panel is provided in the present disclosure, including: a substrate base material, a display module and the package structure hereinabove;

the display module is arranged between the substrate base material and the polarizing structure of the package structure, and the display module includes a second viewing aperture corresponding to the camera.

Optionally, the display module includes an anode layer, a light emitting layer, and a cathode layer stacked in sequence.

Optionally, the display module includes a backlight and a liquid crystal module stacked in sequence.

Optionally, the display panel further includes a touch module, where the touch module is arranged between the display module and the polarizing structure of the package structure.

Optionally, the display panel further includes including a touch module and a second optical adhesive layer, the touch module is arranged between the display module and the polarizing structure of the package structure, and the second optical adhesive layer is arranged between the display module and the touch module.

Optionally, the display panel further includes a heat dissipation structure;

the heat dissipation structure is arranged at a side of the substrate base material away from the display module;

the heat dissipation structure includes a third viewing aperture corresponding to the camera.

A display device including the display panel hereinabove is further provided in the present disclosure.

A method for forming a package structure is further provided in the present disclosure, including:

adhering a first optical adhesive layer to a side of a polarizing structure of a first viewing aperture, to enable the first optical adhesive layer to fill at least a part of the first viewing aperture.

Optionally, the method further includes: adhering a cover plate to a side, away from the polarizing structure, of the first optical adhesive layer; the cover plate includes a protrusion corresponding to the first viewing aperture, or the cover plate includes a protrusion corresponding to the first viewing aperture and a light-shielding ring surrounding the protrusion; the protrusion is in contact with a part of the first optical adhesive layer corresponding to the first viewing aperture.

A method for forming a display panel is further provided in the present disclosure, including:

forming a display module at a side of a substrate base material, to enable the display module to include a second viewing aperture corresponding to a camera;

forming a polarizing structure at a side of the display module away from the substrate base material, to enable the polarizing structure to include a first viewing aperture corresponding to the camera; and adhering a first optical adhesive layer to a side of the polarizing structure, to enable the first optical adhesive layer to fill at least a part of the first viewing aperture.

Optionally, the method further includes: adhering a cover plate to a side, away from the polarizing structure, of the first optical adhesive layer; the cover plate includes a protrusion corresponding to the first viewing aperture, or the cover plate includes a protrusion corresponding to the first viewing aperture and a light-shielding ring surrounding the protrusion; the protrusion is in contact with a part of the first optical adhesive layer corresponding to the first viewing aperture.

Optionally, the forming the polarizing structure at the side of the display module away from the substrate base material includes:

adhering a touch module to a side, away from the substrate base material, of the display module, through a second optical adhesive layer;

forming the polarizing structure at a side of the touch module away from the display module.

Optionally, the method further includes: forming a heat dissipation structure at a side of the substrate base material away from the display module, to enable the heat dissipation structure to include a third viewing aperture corresponding to the camera.

BRIEF DESCRIPTION OF THE DRAWINGS

The above and/or additional aspects and advantages of the present disclosure will become apparent and readily appreciated from the following description of the embodiments, taken in conjunction with the accompanying drawings of which:

FIG. 4 is a schematic view of a display panel according to an embodiment of the present disclosure;

FIG. 5 is a schematic flow chart illustrating a method for forming a package structure according to an embodiment of the disclosure;

DETAILED DESCRIPTION

Figure 1:
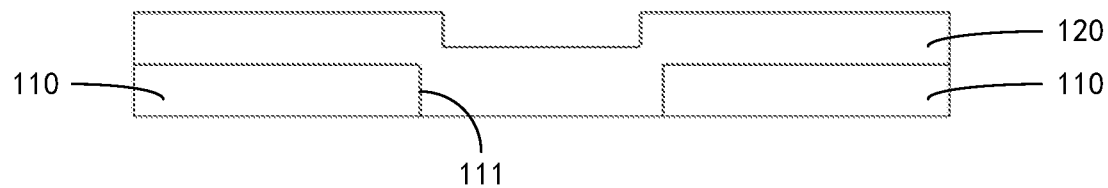
FIG. 1 is a schematic view of a package structure according to an embodiment of the disclosure.

Reference will now be made in detail to the present disclosure, examples of which are illustrated in the accompanying drawings, where like reference numerals refer to the same or similar elements or elements having the same or similar functions throughout. In addition, if a detailed description of known technologies is not necessary for illustrating the features of the present disclosure, it is omitted. The embodiments described below with reference to the accompanying drawings are illustrative only for the purpose of explaining the present disclosure, and are not to be construed as limiting the present disclosure.

As used herein, the singular forms "a", "an", "the" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may also be present. Further, "connected" or "coupled" as used herein may include wirelessly connected or wirelessly coupled. As used herein, the term "and/or" includes all or any element and all combinations of one or more of the associated listed items.

In the related art, in a display product having a front camera, the position of the camera has to be moved into a display area, and usually a viewing aperture for viewing the camera needs to be opened in at least a part of a film layer of a display panel. However, the structural strength of the film layer of the display panel is reduced due to the viewing aperture. Moreover, in the process that the display panel adopts the vacuum to attach the cover plate, stress is formed in the viewing aperture due to vacuum, the stress can cause the film layer structure in the range of the viewing aperture or the corresponding position to be bent and deformed, optical distortion can occur to light obtained through the viewing aperture, and then great influence is caused on the optical performance of the camera.

The present disclosure provides a package structure, a method for forming the same, a display panel, and a display device, which are intended to solve the above technical problems in the related art.

The following describes the technical solutions of the present disclosure and how to solve the above technical problems in detail with specific embodiments.

An embodiment of the present disclosure provides a package structure 100, a schematic view of the package structure 100 is shown in FIG. 1, and the package structure 100 includes: a polarizing structure 110 and a first optical adhesive layer 120.

The polarizing structure 110 has a first viewing aperture 111 corresponding to the camera.

The first optical adhesive layer 120 is arranged at a side of the polarizing structure 110, and the first optical adhesive layer 120 at least fills a portion of the first viewing aperture 111.

In this embodiment, the package structure 100 including the polarizing structure 110 and the first optical adhesive layer 120 is adopted, and the polarizing structure 110 has a first viewing aperture 111 corresponding to the camera, so as to facilitate the viewing of the camera. At least a part of the first viewing aperture is filled with the first optical adhesive layer. On the one hand, it is able to reduce the influence because of the film layer intensity reduction that the viewing aperture brought, and on the other hand, it is able to reduce the vacuum degree in the viewing aperture in the process of adhering the covering plate 130, thereby reducing the bending deformation that probably takes place at the film layer structure of the aperture or corresponding portion of viewing aperture, guaranteeing the optical property of camera.

In some embodiments of the present disclosure, a ratio of a thickness of a portion of the first optical adhesive layer 120 arranged in the first viewing aperture 111 to a depth of the first viewing aperture 111 is not less than 0.13, so as to provide suitable strength against vacuum deformation.

Optionally, the first optical adhesive layer 120 is arranged at a side of the portion inside the first viewing aperture 111, and is flush with the other side of the polarizing structure 110, so that the first optical adhesive layer 120 can completely fill the first viewing aperture 111 of the polarizing structure 110, the film strength of the polarizing structure 110 can be further improved, possible bending deformation of the film structure in the viewing aperture range or at the corresponding position can be further reduced, and the optical performance of the camera is ensured.

Specifically, the first optical adhesive may be a high-fluidity 71-series optical adhesive from 3M company, which has a 30% offset filling capability. For example, the thickness of the polarizing structure 110 is 67 micrometers, the thickness of the first optical adhesive layer 120 is 150 micrometers, and after the first viewing aperture 111 is completely filled with the first optical adhesive layer 120, a certain recess is formed in a portion of the first optical adhesive layer 120, which is away from one side of the polarizing structure 110 and corresponds to the first viewing aperture 111, and the depth of the recess is 67 micrometers× 30% approximately equal to 22 micrometers.

Figure 2:
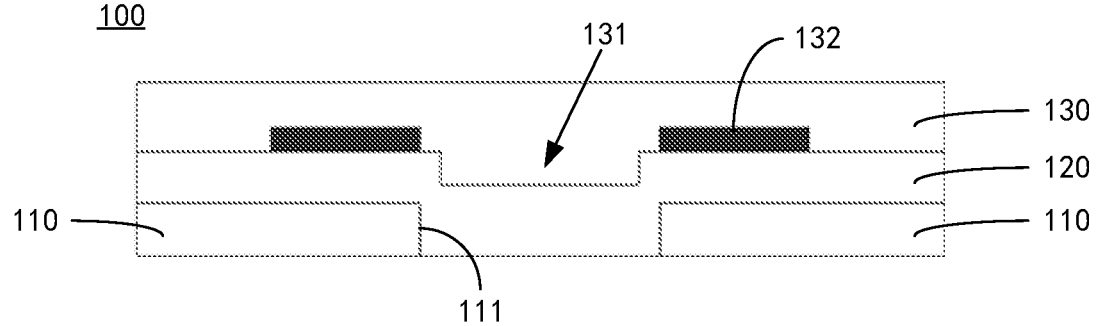
FIG. 2 is a schematic view of a package structure according to an embodiment of the present disclosure.

The depression formed on the first optical adhesive layer 120 may cause bubbles to appear when the cover plate 130 is adhered, and the bubbles may affect the attachment degree between the first optical adhesive layer 120 and the cover plate 130. To this end, the present disclosure provides one possible implementation for the package structure 100 as follows:

as shown in FIG. 2, the package structure 100 of the embodiment of the present disclosure further includes a cover plate 130.

The cover plate 130 is arranged on a side of the first optical adhesive layer 120 away from the polarizing structure 110.

One side of the cover plate 130 close to the first optical adhesive layer 120 includes a protrusion 131 corresponding to the first viewing aperture 111.

In this embodiment, the protrusion 131 of the cover plate 130 may compensate for a space between the recess formed on the first optical adhesive layer 120 and the cover plate 130, so as to effectively reduce bubbles that may occur after the first optical adhesive layer 120 is adhered to the cover plate 130, and further improve the attachment degree of the cover plate 130 to the first optical adhesive layer 120.

In some embodiments of the present disclosure, the protrusion 131 is in contact with a portion of the first optical glue layer 120 corresponding to the first viewing aperture 111.

In this embodiment, after the protrusion 131 on the cover plate 130 is in contact with the portion of the first optical adhesive layer 120 corresponding to the first viewing aperture 111, the degree of adhesion between the cover plate 130 and the first optical adhesive layer 120 is further improved, which is also beneficial to improving the optical performance of the cover plate 130 corresponding to the first viewing aperture 111 with the first optical adhesive layer 120, and further ensuring the optical performance of the camera.

In some embodiments of the present disclosure, the cover plate 130 has a light-shielding ring 132 surrounding the protrusion 131, and the light-shielding ring 132 can shield light, so as to shield unnecessary stray light when the camera captures a view.

Optionally, the light-shielding ring 132 may be made of ink, i.e., a ring of ink may be coated around the protrusion 131 of the cover plate 130.

Figure 3:
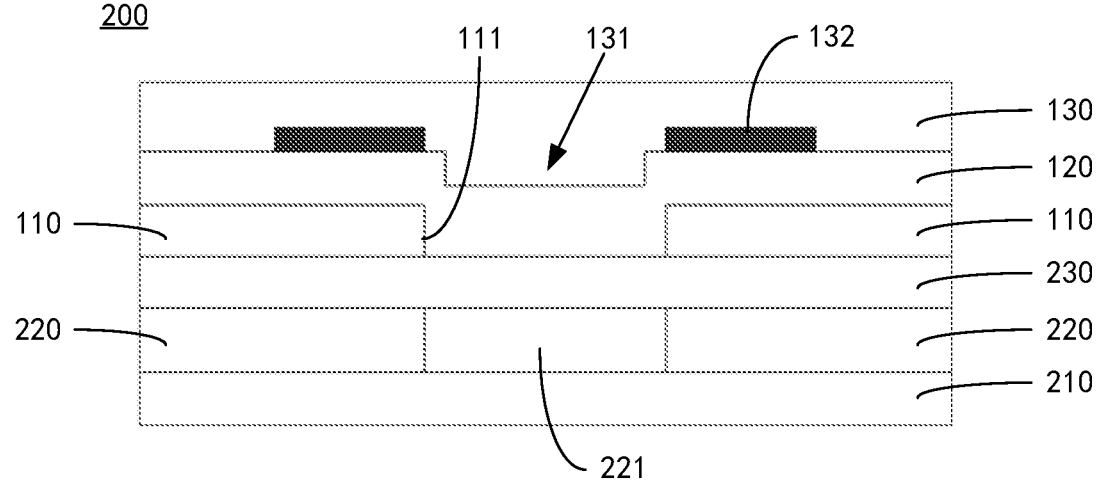
FIG. 3 is a schematic view of a display panel according to an embodiment of the disclosure.

An embodiment of the present disclosure provides a display panel 200, where a schematic view of the display panel 200 is shown in FIG. 3, and the display panel 200 includes: a substrate base material 210, a display module 220 and any of the package structures 100 provided in the previous embodiments.

The display module 220 is arranged between the substrate base material 210 and the polarizing structure 110 of the package structure 100, and the display module 220 has a second viewing aperture 221 corresponding to the camera.

In the present embodiment, the substrate base material 210 provides a base for forming an upper layer film including the display module 220; the display module 220 is used for displaying a picture; the package structure 100 is adhered to a side of the display module 220 away from the substrate base material 210 for protecting the display module 220. The second viewing aperture 221 of the display module 220 is used for capturing a view.

Optionally, the display module 220 and the polarizing structure 110 of the package structure 100 may be bonded by the second adhesive layer 230. This may enable the fabrication of a unitary structure including the display module 220 and the substrate base material 210, separately from the package structure 100.

In some embodiments of the present disclosure, the display module 220 includes an anode layer, a light emitting layer, and a cathode layer, stacked in sequence.

In the present embodiment, the display module 220 adopts a display structure such as an LED (Light Emitting Diode), a Micro-LED (Micro Light Emitting Diode), an OLED (Organic Light-Emitting Diode), or the like.

In some embodiments of the present disclosure, the display module 220 includes a backlight source and a liquid crystal module stacked in sequence.

In this embodiment, the Display module 220 may adopt a Display structure of an LCD (Liquid Crystal Display).

In some embodiments of the present disclosure, as shown in FIG. 4, the display panel 200 further includes a touch module 240, and the touch module 240 is arranged between the display module 220 and the polarizing structure 110 of the package structure 100.

In the present embodiment, the touch module 240 provides a touch function for human-computer interaction for the display panel 200, and the touch module 240 is closer to the package structure 100 than the display module 220, which is beneficial to shortening the distance from the touch module 240 to the cover plate 130, so as to improve the touch sensitivity.

Optionally, the touch module 240 may be directly formed on a side of the display module 220 close to the package structure 100, which may be beneficial to realize that the touch module 240 and the display module 220 share a part of the film layer, thereby realizing the thinning of the display panel 200.

In some embodiments of the present disclosure, as shown in FIG. 4, the display panel 200 further includes a touch module 240 and a second optical adhesive layer 230, the touch module 240 is arranged between the display module 220 and the polarizing structure 110 of the package structure 100, and the second optical adhesive layer 230 is arranged between the display module 220 and the touch module 240.

In the present embodiment, the touch module 240 and the display module 220 can be bonded by the second optical adhesive layer 230, which is beneficial to realizing independent preparation of the touch module 240, so that when the display panel 200 is manufactured, only the finished touch module 240 needs to be bonded with the display module 220, and the forming process of the display panel 200 can be simplified.

In some embodiments of the present disclosure, as shown in FIG. 4, the display panel 200 further includes a heat dissipation structure 250.

The heat dissipation structure 250 is arranged on a side of the substrate base material 210 away from the display module 220.

The heat dissipation structure 250 has a third viewing aperture 251 corresponding to the camera.

In the present embodiment, the heat dissipation structure 250 can facilitate heat conduction from the inside of the display panel 200, so as to provide good heat dissipation for the display panel 200. The third viewing aperture 251 of the heat dissipation structure 250 facilitates the camera capture a view.

Optionally, the heat dissipation structure 250 may be made of a material with good thermal conductivity, such as metal.

Optionally, the heat dissipation structure 250 may be in contact with the camera to achieve heat conduction with the camera, which is beneficial to help the camera dissipate heat.

The disclosed embodiments provide a display device, including: any of the package structures 100 provided in the previous embodiments, or, any of the display panels 200 as provided in the previous embodiments.

In this embodiment, as the display device adopts any one of the package structures 100 provided in the foregoing embodiments or any one of the display panels 200 provided in the foregoing embodiments, please refer to the foregoing embodiments for the principle and technical effect, which will not be described herein again.

The embodiment of the present disclosure provides a method for forming a package structure 100, the method including:

the first optical adhesive layer 120 is adhered to one side of the polarizing structure 110 having the first viewing aperture 111, so that at least a portion of the first viewing aperture 111 is filled with the first optical adhesive layer 120.

In this embodiment, the package structure 100 including the polarizing structure 110 and the first optical adhesive layer 120 is adopted, and the polarizing structure 110 has a first viewing aperture 111 corresponding to the camera, so as to facilitate the viewing of the camera. At least a part of the first viewing aperture is filled with the first optical adhesive layer. On the one hand, it is able to reduce the influence because of the film layer intensity reduction that the viewing aperture brought, and on the other hand, it is able to reduce the vacuum degree in the viewing aperture in the process of adhering the covering plate 130, thereby reducing the bending deformation that probably takes place at the film layer structure of the aperture or corresponding portion of viewing aperture, guaranteeing the optical property of camera.

The embodiment of the present disclosure provides another method for forming a package structure, and a schematic flow chart of the method is shown in FIG. 5, and the method includes the following steps S101 to S102:

S101: adhering the first optical adhesive layer to one side of the polarizing structure with the first viewing aperture so that the first optical adhesive layer at least fills part of the first viewing aperture.

S102: adhering the cover plate to one side, away from the polarizing structure, of the first optical adhesive layer. The cover plate includes a protrusion corresponding to the first viewing aperture, or the cover plate includes a protrusion corresponding to the first viewing aperture and a light-shielding ring surrounding the protrusion; the protrusion is contacted with the part of the first optical adhesive layer corresponding to the first viewing aperture.

In the present embodiment, on the basis that the first optical adhesive layer 120 at least partially fills the first viewing aperture 111 provided in the foregoing embodiment, a specific cover plate adhering process is added, that is, the protrusion 131 of the cover plate 130 is in contact with the portion of the first optical adhesive layer 120 corresponding to the first viewing aperture 111, so that a space between the recess formed on the first optical adhesive layer 120 and the cover plate 130 can be compensated, bubbles which may occur after the first optical adhesive layer 120 and the cover plate 130 are adhered can also be effectively reduced, and the adhering degree between the cover plate 130 and the first optical adhesive layer 120 is further improved.

Figure 6:
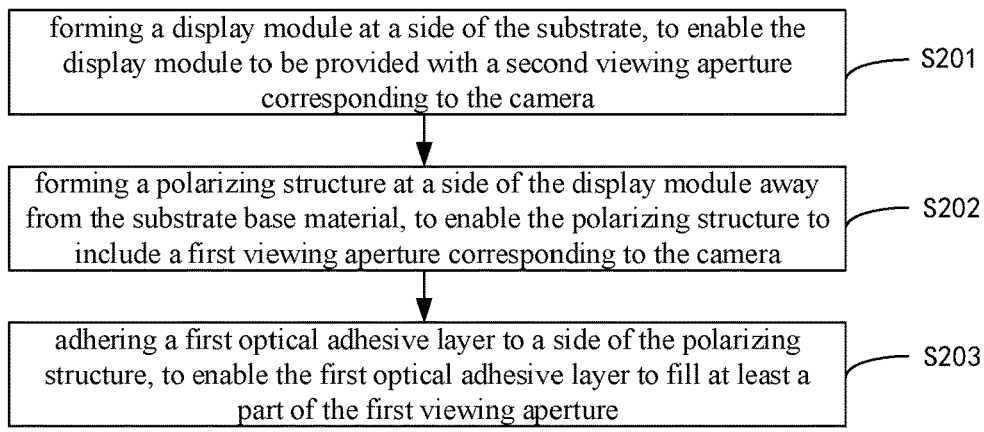
FIG. 6 is a schematic flowchart illustrating a method for forming a display panel according to an embodiment of the disclosure.

The embodiment of the present disclosure provides a method for forming a display panel, and a schematic flow chart of the method is shown in FIG. 6, and includes the following steps S201 to S203:

S201: forming a display module at a side of the substrate, to enable the display module to be provided with a second viewing aperture corresponding to the camera.

S202: forming a polarizing structure at a side of the display module away from the substrate base material, to enable the polarizing structure to include a first viewing aperture corresponding to the camera.

S203: adhering a first optical adhesive layer to a side of the polarizing structure, to enable the first optical adhesive layer to fill at least a part of the first viewing aperture.

The embodiment provides a method for forming a display panel, the package structure 100 including the polarizing structure 110 and the first optical adhesive layer 120 is adopted, and the polarizing structure 110 has a first viewing aperture 111 corresponding to the camera, so as to facilitate the viewing of the camera. At least a part of the first viewing aperture is filled with the first optical adhesive layer. On the one hand, it is able to reduce the influence because of the film layer intensity reduction that the viewing aperture brought, and on the other hand, it is able to reduce the vacuum degree in the viewing aperture in the process of adhering the covering plate 130, thereby reducing the bending deformation that probably takes place at the film layer structure of the aperture or corresponding portion of viewing aperture, guaranteeing the optical property of camera.

Figure 7:
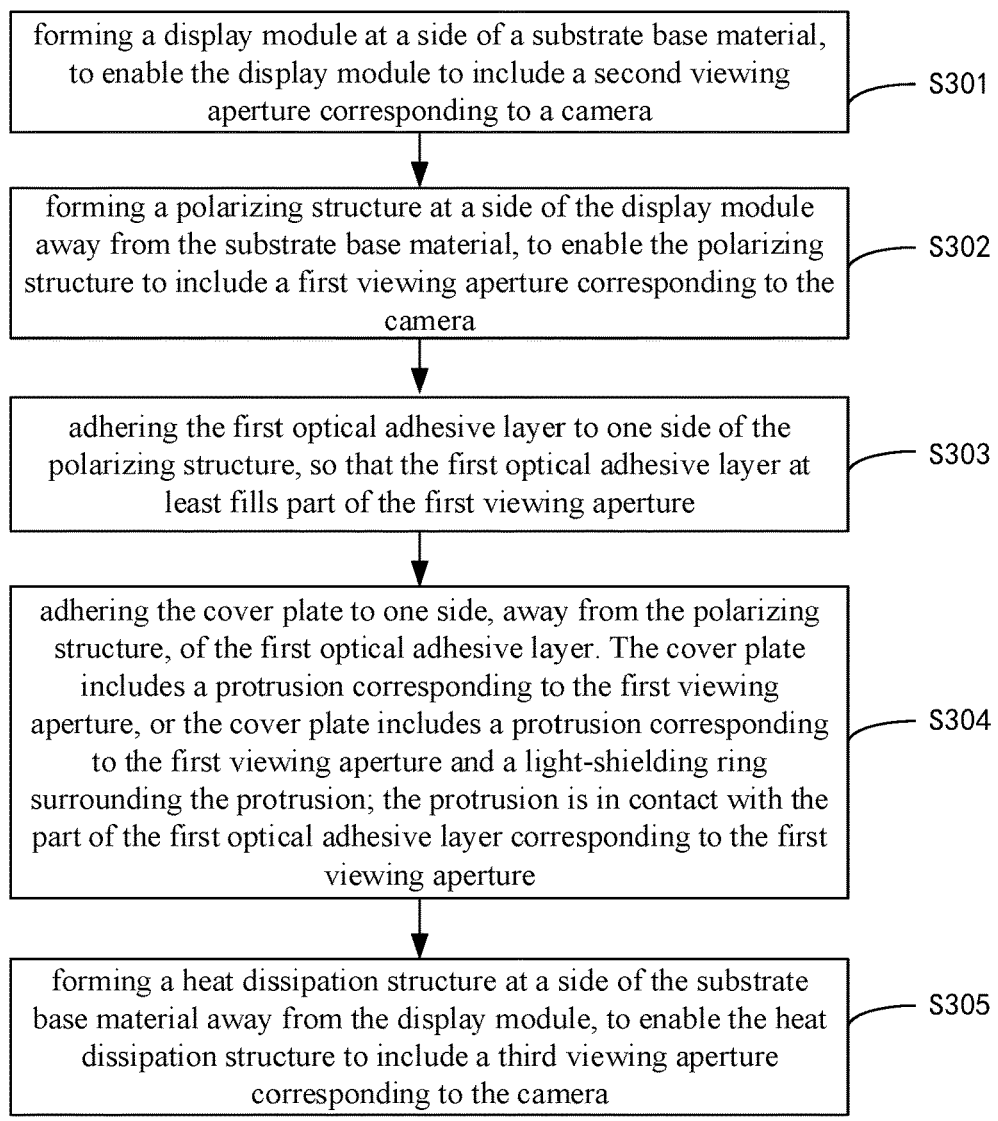
FIG. 7 is a schematic flow chart illustrating a method for forming a display panel according to an embodiment of the present disclosure.

The embodiment of the present disclosure provides a method for a method for forming a display panel, where a flow diagram of the method for unfolding is shown in FIG. 7, and the method includes the following steps S301 to S305:

S301: forming a display module at a side of a substrate base material, to enable the display module to include a second viewing aperture corresponding to a camera.

Figure 8:
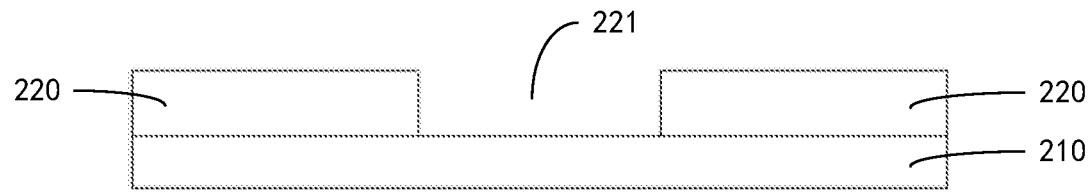
FIG. 8 is a schematic view of a film layer after a display module is formed at a side of a substrate and has a second viewing aperture corresponding to a camera in a method of a method for forming a display panel according to an embodiment of the present disclosure.

The film layer structure obtained through this step is shown in FIG. 8, and includes a substrate base material 210 and a display module 220 arranged at a side of the substrate base material 210, where the display module 220 has a second viewing aperture 221 corresponding to the camera.

Optionally, the display module 220 may adopt a display structure such as an LED (Light Emitting Diode), a Micro-LED (Micro Light Emitting Diode), or an OLED (Organic Light-Emitting Diode); the Display module 220 may also adopt a Display structure of an LCD (Liquid Crystal Display).

S302: forming a polarizing structure at a side of the display module away from the substrate base material, to enable the polarizing structure to include a first viewing aperture corresponding to the camera.

Figure 9:
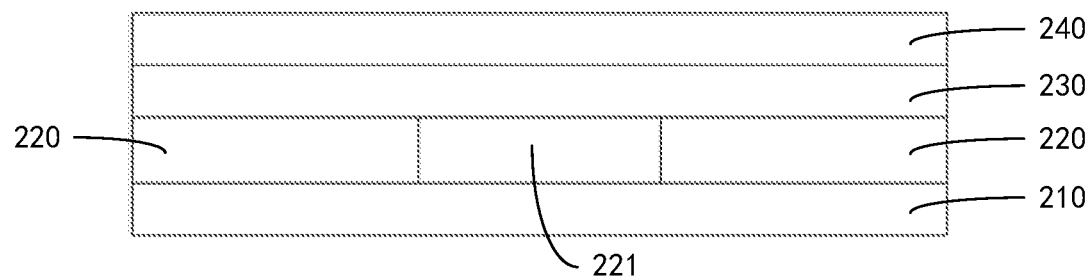
FIG. 9 is a schematic view of a film layer after a touch module is adhered to a side of the display module away from the substrate through a second optical adhesive layer in a method of the method for forming a display panel according to an embodiment of the present disclosure.
Figure 10:
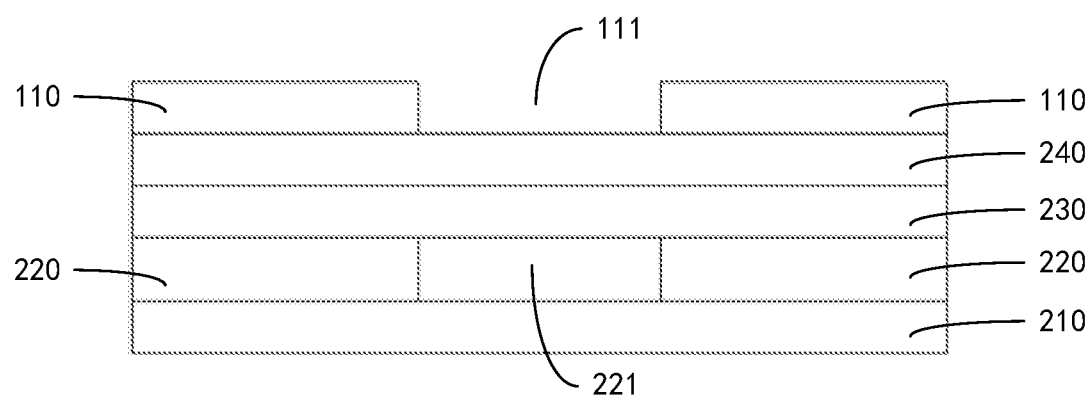
FIG. 10 is a schematic view of a film structure after a polarizing structure is formed on a side of a touch module away from a display module in a method of a method for forming a display panel according to an embodiment of the present disclosure.

Optionally, in step S302, the forming of the polarizing structure on the side of the display module away from the substrate base material includes:

adhering a touch module to a side, away from the substrate base material, of the display module, through a second optical adhesive layer. The film structure obtained through this step is shown in FIG. 9, and further includes a second optical adhesive layer 230 and a touch module 240 on a side of the display module 220 away from the substrate base material 210;

The polarizing structure is formed at a side of the touch module away from the display module. The film layer structure obtained through this step is shown in FIG. 10, and further includes a polarizing structure 110 on a side of the touch module 240 away from the display module 220.

S303: adhering the first optical adhesive layer to one side of the polarizing structure, so that the first optical adhesive layer at least fills part of the first viewing aperture.

S304: adhering the cover plate to one side, away from the polarizing structure, of the first optical adhesive layer. The cover plate includes a protrusion corresponding to the first viewing aperture, or the cover plate includes a protrusion corresponding to the first viewing aperture and a light-shielding ring surrounding the protrusion; the protrusion is in contact with the part of the first optical adhesive layer corresponding to the first viewing aperture.

Figure 11:
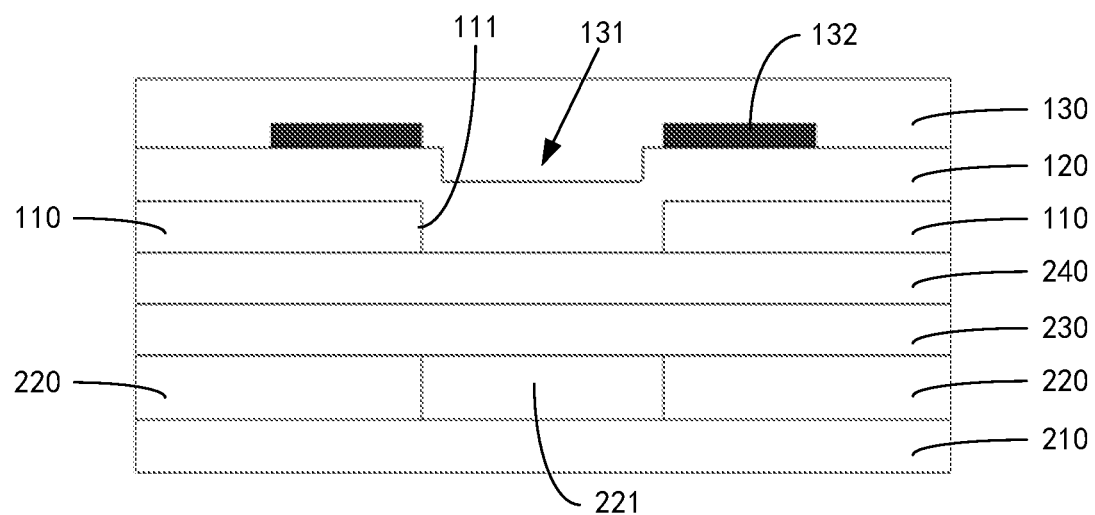
FIG. 11 is a schematic view of a film structure in a method for forming a display panel according to an embodiment of the present disclosure, in which a first optical adhesive layer is adhered to one side of a polarizing structure, so that at least a portion of the first optical adhesive layer is filled in the first viewing aperture, and a cover plate is adhered to one side of the first optical adhesive layer away from the polarizing structure.

The film layer structure obtained through steps S303 and S304 is as shown in FIG. 11, and the first optical adhesive layer 120 at least fills a part of the first viewing aperture 111 to compensate for a structural vacancy caused by the viewing aperture, so that on one hand, the influence of the reduction of the film layer strength caused by the viewing aperture can be reduced, on the other hand, the vacuum degree in the viewing aperture in the process of vacuum-adhering the cover plate can be reduced, the bending deformation which may occur in the film layer structure in the viewing aperture range or the corresponding position can be reduced, and the optical performance of the camera can be ensured. The protrusion 131 of the cover plate 130 is in contact with the portion of the first optical adhesive layer 120 corresponding to the first viewing aperture 111, so that a space between the recess formed on the first optical adhesive layer 120 and the cover plate 130 can be compensated, bubbles which may occur after the first optical adhesive layer 120 and the cover plate 130 are adhered can be effectively reduced, and the adhering degree of the cover plate 130 and the first optical adhesive layer 120 is further improved.

Optionally, ink surrounding the protrusion 131 may be coated on the cover plate 130 to form a light-shielding ring 132, and the light-shielding ring 132 may function as a light-shielding to shield unnecessary stray light when the camera is used for viewing.

S305: forming a heat dissipation structure at a side of the substrate base material away from the display module, to enable the heat dissipation structure to include a third viewing aperture corresponding to the camera.

The film layer structure obtained through this step is shown in FIG. 4, and the heat dissipation structure 250 is formed on the side of the substrate base material 210 away from the display module 220, so that the heat dissipation structure 250 can be beneficial to conducting out the heat inside the display panel 200, and provide good heat dissipation for the display panel 200. The third viewing aperture 251 of the heat dissipation structure 250 facilitates the camera capture a view.

By applying the embodiment of the disclosure, the following beneficial effects can be at least realized:

1. The package structure 100 including the polarizing structure 110 and the first optical adhesive layer 120 is adopted, and the polarizing structure 110 has a first viewing aperture 111 corresponding to the camera, so as to facilitate the viewing of the camera. At least a part of the first viewing aperture is filled with the first optical adhesive layer. On the one hand, it is able to reduce the influence because of the film layer intensity reduction that the viewing aperture brought, and on the other hand, it is able to reduce the vacuum degree in the viewing aperture in the process of adhering the covering plate 130, thereby reducing the bending deformation that probably takes place at the film layer structure of the aperture or corresponding portion of viewing aperture, guaranteeing the optical property of camera.

2. The protrusion 131 of the cover plate 130 can compensate for a space between the recess formed on the first optical adhesive layer 120 and the cover plate 130, and can effectively reduce bubbles which may occur after the first optical adhesive layer 120 is adhered to the cover plate 130, thereby improving the adhering degree of the cover plate 130 and the first optical adhesive layer 120.

3. After the contact of the part of the cover plate 130 corresponding to the first viewing aperture 111, the protrusion 131 on the cover plate 130 is in contact with the first optical adhesive layer 120, so that the degree of attachment of the cover plate 130 to the first optical adhesive layer 120 is further improved, the optical performance of the cover plate 130 corresponding to the first viewing aperture 111 to the first optical adhesive layer 120 is also improved, and the optical performance of the camera is further ensured.

Those of skill in the art will appreciate that the various operations, methods, steps, measures, schemes in the various operations, methods, flows that have been discussed in this disclosure may be alternated, modified, combined, or eliminated. Further, having various other steps, measures, or schemes in the operations, methods, or procedures that have been discussed in this disclosure may also be alternated, modified, rearranged, broken down, combined, or deleted. Further, steps, measures, schemes in various operations, methods, procedures disclosed in the related art and the present disclosure may also be alternated, changed, rearranged, decomposed, combined, or deleted.

In the description of the present disclosure, it is to be understood that the terms "center", "upper", "lower", "front", "rear", "left", "right", "vertical", "horizontal", "top", "bottom", "inner", "outer", and the like indicate orientations or positional relationships based on those shown in the drawings, merely for convenience in describing the present disclosure and simplifying the description, and do not indicate or imply that the device or element referred to must have a particular orientation, be constructed in a particular orientation, and be operated, and therefore, should not be construed as limiting the present disclosure.

The terms "first", "second" and "first" are used for descriptive purposes only and are not to be construed as indicating or implying relative importance or to implicitly indicate the number of technical features indicated. Thus, a feature defined as "first" or "second" may explicitly or implicitly include one or more of that feature. In the description of the present disclosure, the meaning of "a plurality" is two or more unless otherwise specified.

In the description of the present disclosure, it should be noted that, unless otherwise explicitly stated or limited, the terms "mounted," "connected," and "connected" are to be construed broadly, e.g., as being fixedly connected, detachably connected, or integrally connected; they may be connected directly or indirectly through intervening media, or they may be interconnected between two elements. The specific meaning of the above terms in the present disclosure can be understood in a specific case to those of ordinary skill in the art.

The particular features, structures, materials, or characteristics may be combined in any suitable manner in any one or more embodiments or examples.

It should be understood that, although the steps in the flowcharts of the figures are shown in order as indicated by the arrows, the steps are not necessarily performed in order as indicated by the arrows. The steps are not performed in the exact order shown and may be performed in other orders unless otherwise indicated herein. Moreover, at least a portion of the steps in the flow chart of the figure may include multiple sub-steps or multiple stages, which are not necessarily performed at the same time, but may be performed at different times, and the order of execution is not necessarily sequential, but may be performed alternately or alternately with other steps or at least a portion of the sub-steps or stages of other steps.

The foregoing is illustrative of only some embodiments of the disclosure, and it will be appreciated by those skilled in the art that various modifications and adaptations can be made without departing from the principles of the disclosure, and are intended to be within the scope of the disclosure.

What is claimed is:

1. A display panel, comprising: a substrate base material, a display module, a package structure and a cover plate;
    wherein the package structure comprises: a polarizing structure and a first optical adhesive layer;
    the polarizing structure comprises a first viewing aperture corresponding to a camera;
    the first optical adhesive layer is arranged at a side of the polarizing structure, and at least a part of the first viewing aperture is filled with the first optical adhesive layer; a recess is formed in a portion of the first optical adhesive layer away from one side of the polarizing structure and corresponding to the first viewing aperture; a depth of the recess is less than a thickness of a portion of the first optical adhesive layer corresponding to a portion of the polarizing structure other than the first viewing aperture;
    the display module is arranged between the substrate base material and the polarizing structure of the package structure, and the display module comprises a second viewing aperture corresponding to the camera;
    the cover plate is arranged at the one side, away from the polarizing structure, of the first optical adhesive layer;
    a protrusion corresponding to the first viewing aperture is at a side of the cover plate close to the first optical adhesive layer;
    the protrusion of the cover plate compensates for a space between the recess formed on the first optical adhesive layer and the cover plate;
    the cover plate comprises a light-shielding ring surrounding the protrusion, and an orthogonal projection of the light-shielding ring onto the cover plate does not overlap an orthogonal projection of the recess onto the cover plate.

2. The display panel according to claim 1, wherein the display module comprises an anode layer, a light emitting layer, and a cathode layer stacked in sequence.

3. The display panel according to claim 1, wherein the display module comprises a backlight and a liquid crystal module stacked in sequence.

4. The display panel according to claim 1, further comprising a touch module, wherein the touch module is arranged between the display module and the polarizing structure of the package structure.

5. The display panel according to claim 4, further comprising a heat dissipation structure;
    the heat dissipation structure is arranged at a side of the substrate base material away from the display module;
    the heat dissipation structure comprises a third viewing aperture corresponding to the camera.

6. The display panel according to claim 1, further comprising a touch module and a second optical adhesive layer, the touch module is arranged between the display module and the polarizing structure of the package structure, and the second optical adhesive layer is arranged between the display module and the touch module.

7. A display device comprising the display panel according to claim 1.

8. The display panel according to claim 1, wherein a ratio of a thickness of a portion of the first optical adhesive layer arranged in the first viewing aperture to a depth of the first viewing aperture is not less than 0.13.

9. The display panel according to claim 1, wherein the protrusion is in contact with the portion of the first optical adhesive layer corresponding to the first viewing aperture.

10. The display panel according to claim 1, wherein the protrusion is in contact with the portion of the first optical adhesive layer corresponding to the first viewing aperture.

* * * * *